United States Patent [19]

Kunitomo

[11] Patent Number: 5,396,652
[45] Date of Patent: Mar. 7, 1995

[54] TRANSMITTING POWER CONTROL UNIT HAVING A CONSTANT OUTPUT LEVEL THROUGHOUT A PREDETERMINED FREQUENCY BAND

[75] Inventor: Kouichi Kunitomo, Yokohama, Japan

[73] Assignee: Matsushita Electric Industrial Co., Ltd., Osaka, Japan

[21] Appl. No.: 926,306

[22] Filed: Aug. 10, 1992

[30] Foreign Application Priority Data

Aug. 21, 1991 [JP] Japan .................... 3-209191

[51] Int. Cl.⁶ .................................... H04B 1/40
[52] U.S. Cl. .................... 455/75; 455/116; 455/126
[58] Field of Search ............ 455/13.4, 63, 75, 76, 455/107, 113, 115, 126, 116, 127

[56] References Cited

U.S. PATENT DOCUMENTS

| | | | |
|---|---|---|---|
| 3,958,186 | 5/1976 | Jesse et al. | 455/113 |
| 4,392,245 | 7/1983 | Mitama | 455/115 |
| 4,918,431 | 4/1990 | Borras | 455/107 |
| 5,081,713 | 1/1992 | Miyazaki | 455/115 |
| 5,212,814 | 5/1993 | Iwane | 455/107 |

FOREIGN PATENT DOCUMENTS

| | | | |
|---|---|---|---|
| 0416613 | 3/1991 | European Pat. Off. | |
| 0261231 | 11/1987 | Japan | 455/13.4 |
| 1293016 | 11/1989 | Japan | |

Primary Examiner—Edward F. Urban
Attorney, Agent, or Firm—Stevens, Davis, Miller & Mosher

[57] ABSTRACT

A transmitting power control unit which generates and transmits a wideband transmission signal with a power level which does not differ by frequency. This transmitting power control unit includes means for generating voltage corresponding to a frequency of a transmission signal. The power of the transmission signal is controlled by added the voltage which is obtained by adding the generated voltage to a fixed voltage according to power control information. The power-controlled transmission signal is transmitted from an antenna with a frequency band thereof limited by a filter.

5 Claims, 4 Drawing Sheets

POINT A

POINT B

POINT C

TRANSMITTING POWER CONTROL UNIT HAVING A CONSTANT OUTPUT LEVEL THROUGHOUT A PREDETERMINED FREQUENCY BAND

BACKGROUND OF THE INVENTION

1. Field of the Invention

The present invention relates to a transmitting power control unit, having a wide-band which is utilized in mobile communication equipment, such as automobile telephones and portable telephones.

2. Description of Related Art

FIG. 1 is a block diagram of a conventional transmitting power control unit. In FIG. 1, a reference numeral 11 represents a control section for generating channel information for designating a transmission frequency and power control information for designating the power to be transmitted, 12 represents a PLL circuit for stabilizing the transmission frequency, 13 represents a power amplifier for amplifying the output of the PLL circuit 12, 14 represents a directional coupler for detecting the passing power, 15 represents a filter for removing higher harmonic components of a transmission signal to be transmitted and also for suppressing thermal noise, 16 represents an antenna for radiating a transmission signal in the air, 17 represents a detector diode for detecting a signal obtained by the directional coupler 14, 18 represents a differential amplifier for amplifying the difference between a detected signal voltage detected by the detector diode 17 and a fixed reference voltage, an output of differential amplifier 18 being supplied to the power amplifier 13 as a power control signal, and 19 represents a fixed voltage generator for generating the fixed voltage. Namely, an Auto Power Control (APC) circuit for controlling a power of a transmission signal is constituted by power detecting means composed of the power amplifier 13, the directional coupler 14, and the detector diode 17 and the differential amplifier 18 receiving the detected voltage obtained by the power detecting means and the above-mentioned fixed voltage as input.

Next, the operation of the above-mentioned conventional example will be described. In FIG. 1, a transmission signal having a prescribed frequency band is generated from the PLL circuit 12 in accordance with channel information from the control section 11. This transmission signal is radiated in the air from the antenna 16, through the directional coupler 14 and the filter 15, after being amplified by the power amplifier 13.

Further, a prescribed fixed voltage is generated by the fixed voltage generator 19 in accordance with power control information from the control section 11, and supplied to one input terminal of the differential amplifier 18. A signal obtained by the directional coupler 14 is detected by the detector diode 17 and supplied to the other input terminal of the differential amplifier 18.

Thus, the output power from the power amplifier 13 is controlled by the power control signal outputted from the differential amplifier 18 so as to correspond to the above-mentioned prescribed fixed voltage.

In the conventional transmitting power control unit described above, however, there is a problem that attenuation quantity differ between e.g. the output level for L channel having a low frequency and H channel having a high frequency due to attenuation characteristics of the filter 15, as shown in FIG. 2 in the transmission band. In other words, the output level is as high as $L_L$ in the L channel, and the output level is as low as $L_H$ in the H channel of the transmission band. Thus, the output level changes almost linearly between both channels, and the output level differs depending on the transmission frequency band.

Further, a proposal has also been made that the fixed voltage be supplied to the differential amplifier after being amplified by a voltage-controlled amplifier, and using the control voltage of the voltage-controlled oscillator for generating a transmission signal also as a control signal of the voltage-controlled amplifier, so that the output voltage of this voltage-controlled amplifier is varied by the frequency of the transmission signal, and the output of the transmitter is compensated using the above, to thereby obtain a constant output in a wideband (Japanese Patent Application, JP-A- 1-293016, published Nov. 27, 1989 entitled "CIRCUIT FOR CONTROLLING OUTPUT OF TRANSMITTER"). According to this method, however, such a problem is involved that a voltage-controlled amplifier is required excessively.

SUMMARY OF THE INVENTION

The present invention has been made for the purpose of solving such conventional problems, and its object is to provide an excellent transmitting power control unit in which no difference is generated in output level by a frequency band of a transmission signal.

According to the present invention, in order to achieve the above-mentioned object, a voltage corresponding to a frequency of a transmission signal is generated, this voltage is added to a fixed voltage corresponding to power control information, to thereby control the power of the transmission signal. In addition, the frequency band is limited by means of a filter in signal transmission.

BRIEF DESCRIPTION THE DRAWINGS

Figure 3:
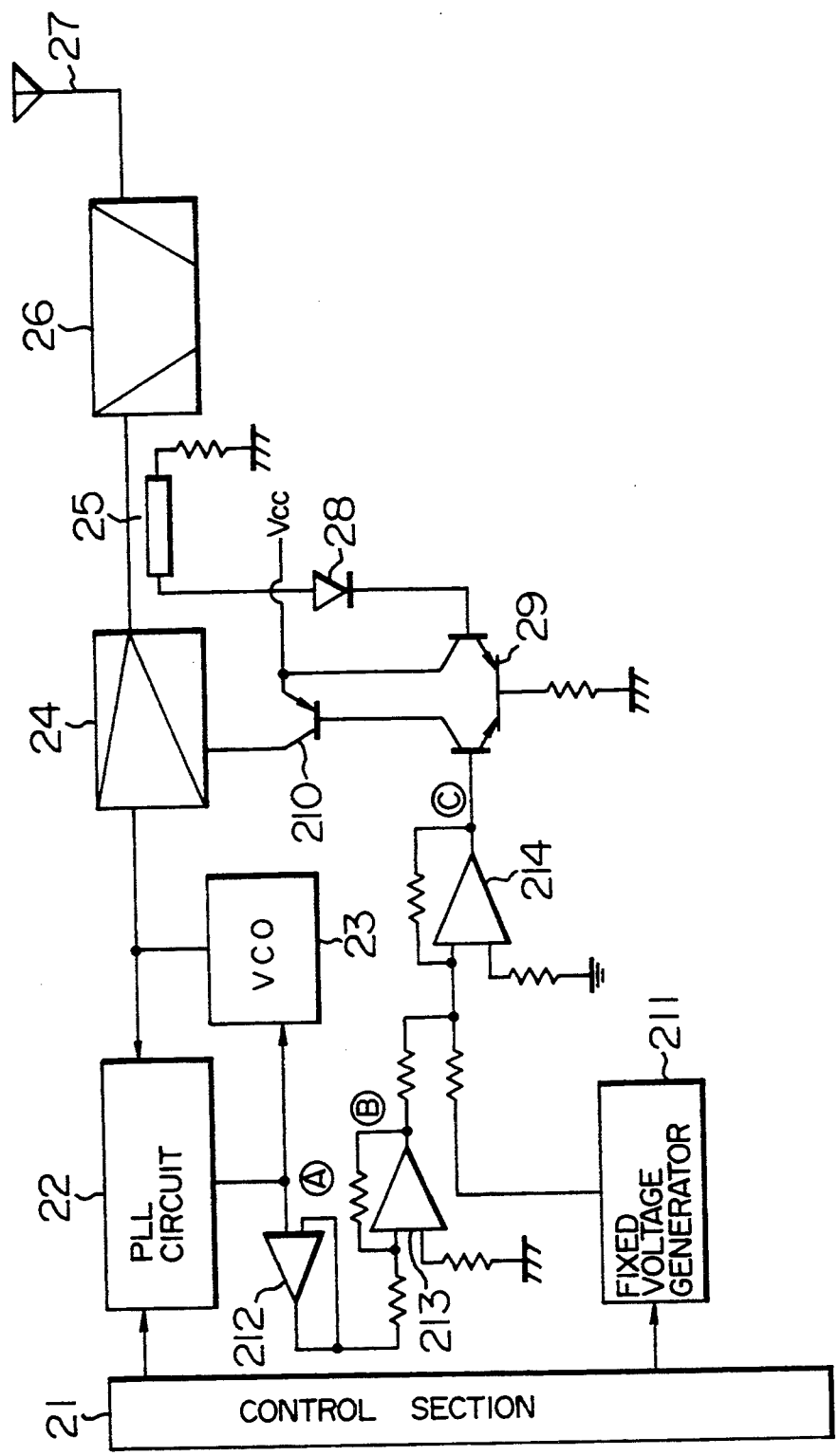
FIG. 3 is a block diagram showing an embodiment of a transmitting power control unit according to the present invention.
Figure 4A:
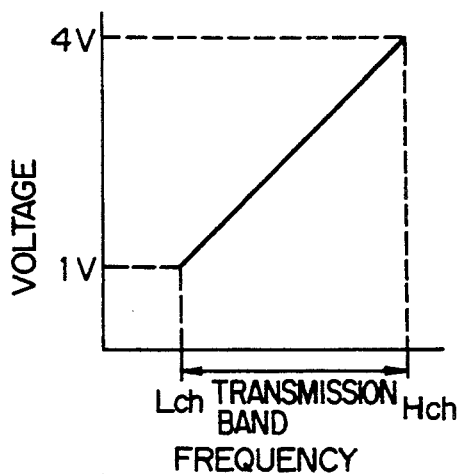
Figure 4B:
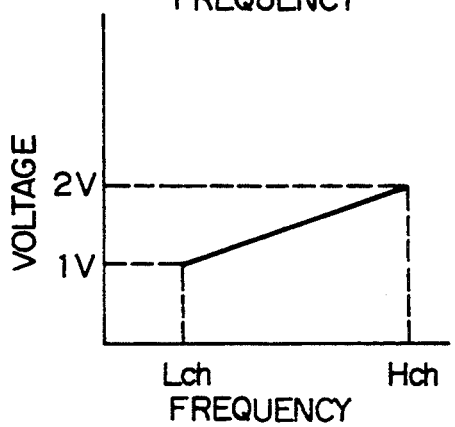
Figure 4C:
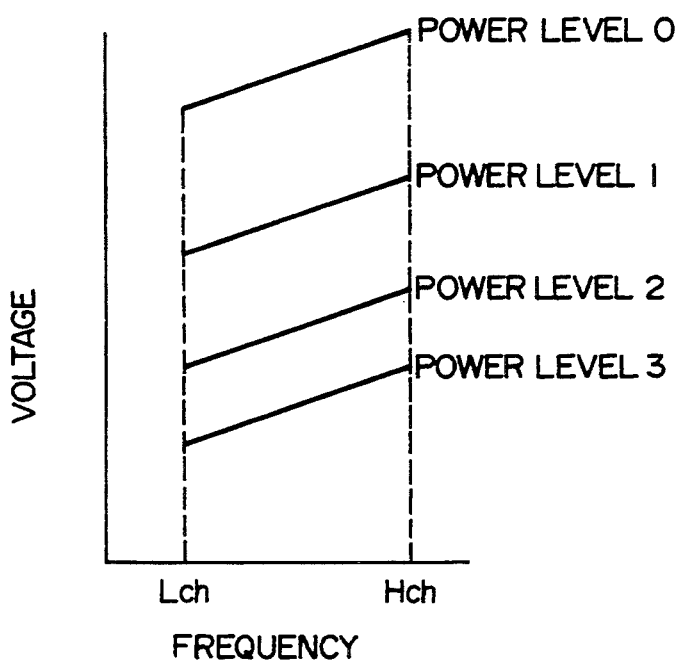

FIG. 4a diagram which shows the relationship between a transmission band and the control voltage at a point A in FIG. 3;

FIG. 4b is a diagram which shows the relationship between a transmission band and the control voltage at a point B in FIG. 3; and FIG. 4c is a diagram which shows the relationship between a transmission band and the control voltage at a point C in FIG. 3.

DESCRIPTION OF THE PREFERRED EMBODIMENTS

An embodiment of the present invention will be described hereinafter with reference to the drawings.

FIG. 3 is a block diagram showing an embodiment of a transmitting power control unit according to the present invention. In FIG. 3, 21 represents a control section for generating channel information for designating a transmission frequency and power control information for designating a power to be transmitted, 22 represents a PLL circuit for stabilizing a transmission frequency, 23 represents a voltage-controlled oscillator (VCO), 24 represents a power amplifier for amplifying the power of the transmission signal which is an output of the VCO 23, 25 represents a directional coupler for detecting passing power, 26 represents a filter for removing higher harmonic components of the signal to be transmitted and suppressing thermal noise, 27 represents an antenna for radiating a transmission signal in the air, 28 represents a detector diode for detecting a signal which is obtained by the directional coupler 25, 29 represents a differential amplifier for generating a power control signal by amplifying the difference between the detected signal detected by the detector diode 28 and a fixed reference voltage, 210 represents a driver transistor for amplifying a power control signal from the differential amplifier 29 and supplying the amplified power control signal to the power amplifier 24, 211 represents a fixed voltage generator for generating fixed voltage, 212 represents a buffer for performing impedance conversion of a control voltage signal which is an output of the PLL circuit 22, 213 represents a direct-current amplifier for amplifying the output of the buffer 212, 214 represents an adder for adding the fixed voltage from the fixed voltage generator 211 to the output of the direct-current amplifier 213 so as to generate added voltage. An APC circuit for controlling the power of the transmission signal is constituted by the power amplifier 24, the directional coupler 25, the detector diode 28 and the differential amplifier 29.

Next, the operation of the above-mentioned embodiment will be described. In FIG. 3, a control voltage signal is generated from the PLL circuit 22 in accordance with channel information from the control section 21. This signal is supplied to the VCO 23, and the output of the VCO 23 is radiated in the air from the antenna 27, through the directional coupler 25 and the filter 26, after being amplified by the power amplifier 24.

On the other hand, the output of the VCO 23 is also supplied to the PLL circuit 22, and voltage is detected in accordance with the phase difference with respect to oscillation signal and fed back to the VCO 23 as a control voltage signal. The relationship between the transmission band and this control voltage signal is shown in FIG. 4a. Namely, the voltage value changes linearly so that the control voltage is low on the low channel Lch side and the control voltage is high on the high channel Hch side in the transmission band.

Figure 1:
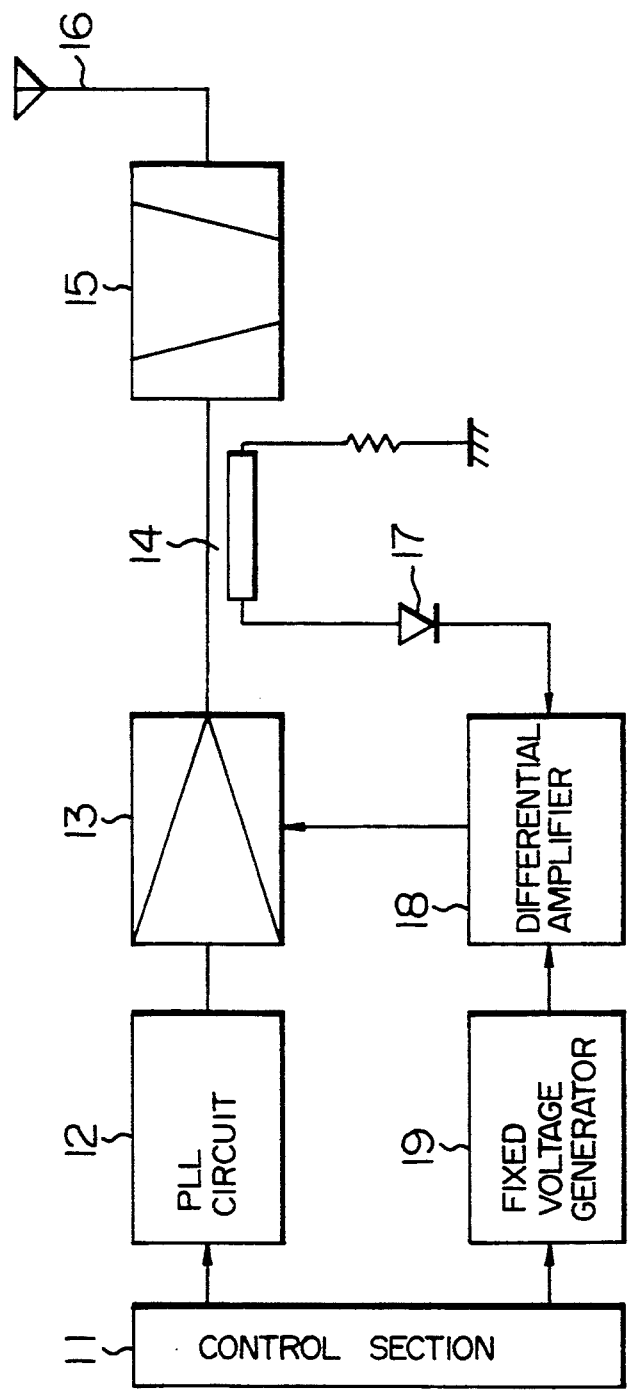
FIG. 1 is a block diagram of a conventional transmitting power control unit.
Figure 2:
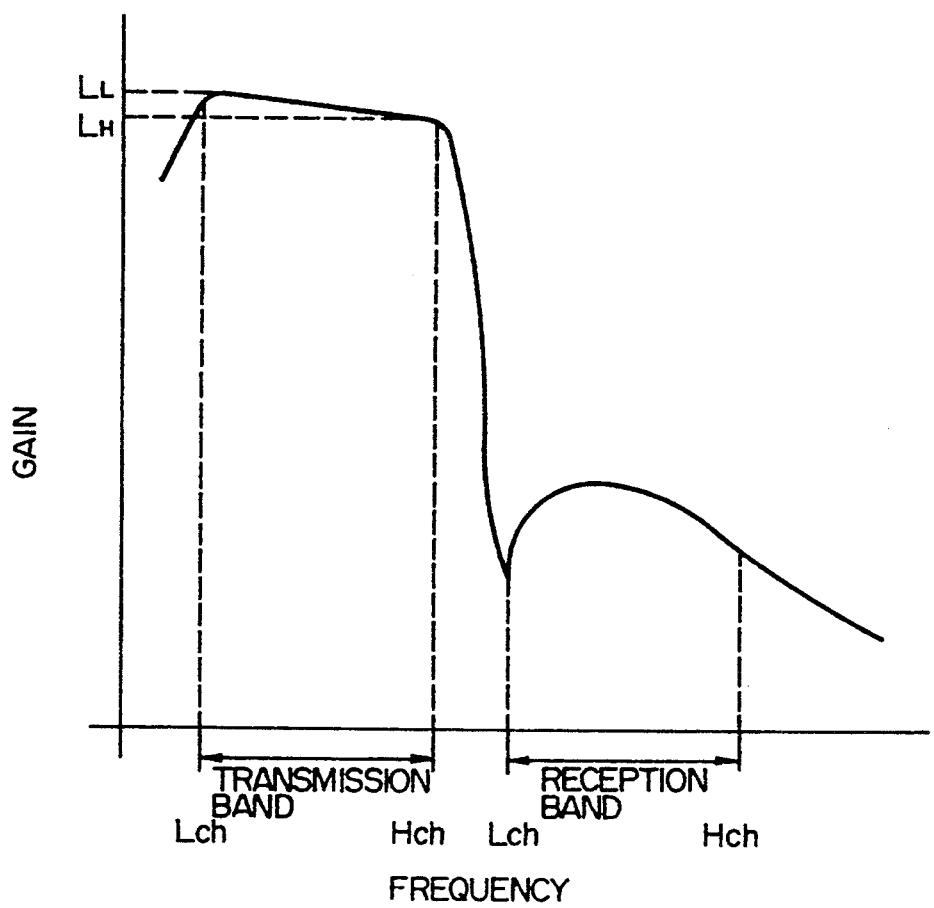
FIG. 2 is a frequency characteristic diagram of a filter in a transmitting power control unit.

The control voltage signal which is the output of the PLL circuit 22 is applied further to the buffer 212 to be converted in impedance, and then amplified by the direct-current amplifier 213 so that the linear gradient of its frequency characteristic is converted. In this conversion, the linear gradient is converted so as to show a reverse characteristic to the frequency characteristic of the filter 26 shown in FIG. 2. The relationship between the transmission band and the control voltage after the conversion is shown in FIG. 4b. The control voltage signal which is the output of the direct-current amplifier 213 is supplied to the adder 214.

On the other hand, prescribed fixed voltage in accordance with various power levels is generated from the fixed voltage generator 211 in accordance with power control information from the control section 21 and supplied to the adder 214. In the adder 214, the fixed voltage which is the output of the fixed voltage generator 211 and the output of the direct-current amplifier 213 are added to each other, and the added output is supplied to the differential amplifier 29. The relationship between the added voltage added in the adder 214 and the transmission band is shown in FIG. 4c. As it is apparent in the figure, respective power levels show higher voltage as the frequency of the transmission band gets higher. A signal obtained from the directional coupler 25 is detected by the detector diode 28 and supplied to the other input terminal of the differential amplifier 29, and the difference between the supplied detected signal and the added output of the adder 214 is amplified and supplied to the power amplifier 24 through the driver transistor 210 so as to control amplification. Accordingly, since it is possible to set the output power level of the power amplifier 24 higher as the frequency of the transmission band gets higher, the overall frequency characteristic including the filter 26 becomes flat, ranging from the low channel to the high channel of the transmission band, thereby making it possible to compensate the frequency characteristic of the filter 26.

It is apparent from the above-mentioned embodiment, according to the present invention, that it is possible to compensate the attenuation frequency characteristic of a filter in a transmitter at a high frequency by utilizing the fact that the voltage value is increased linearly as the frequency gets higher in the relationship between the control voltage and frequency of the PLL circuit so as to convert the increment thereof into an appropriate value and adding it to the fixed voltage so as to set the transmitting power.

I claim:

1. A transmitting power control unit comprising:
   a voltage controlled oscillator (VCO) for generating a transmission signal in accordance with a control voltage signal, an oscillating frequency of said VCO having a substantially linear relationship to said control voltage signal in a predetermined frequency band;
   a phase-lock loop (PLL) circuit, receiving said transmission signal, for (i) detecting a phase difference between said transmission signal and a reference signal indicative of channel information, (ii) generating said control voltage signal, and (iii) supplying said control voltage signal to said VCO so as to control the oscillating frequency of said VCO;
   a fixed voltage generator for generating a fixed voltage signal to designate a power level of the transmission signal in accordance with power control information;
   an adding circuit for generating an added voltage signal by adding said control voltage signal and said fixed voltage signal to each other;
   a power control circuit for controlling the power level of said transmission signal in accordance with said added voltage signal and outputting said transmission signal; and
   a filter, having a substantially linear frequency characteristic in said predetermined frequency band, for limiting a frequency band of the transmission signal outputted from said power control circuit.

2. A transmitting power control unit according to claim 1, wherein said adding circuit generates said added voltage signal so that said added voltage signal has a voltage-to-transmission signal frequency characteristic which is reverse to said frequency characteristic of said filter, whereby said power control circuit compensates for the frequency characteristic of said filter in said predetermined frequency band.

3. A transmitting power control unit according to claim 1, wherein said power control circuit includes a power amplifier for amplifying the power level of the transmission signal generated by said VCO, a power detecting circuit for detecting the power level of the transmission signal amplified by said power amplifier so as to generate a detected voltage signal, and a differential amplifier for receiving said detected voltage signal and said added voltage signal as inputs.

4. A transmitting power control unit according to claim 3, wherein said power detecting circuit comprises a directional coupler.

5. A transmitting power control unit according to claim 4, wherein said power detecting circuit further comprises a detector diode connected to said directional coupler.

* * * * *